United States Patent [19]
Adams et al.

[11] Patent Number: 5,659,950
[45] Date of Patent: Aug. 26, 1997

[54] METHOD OF FORMING A PACKAGE ASSEMBLY

[75] Inventors: Victor J. Adams; David J. Dougherty, both of Tempe, Ariz.

[73] Assignee: Motorola, Inc., Schaumburg, Ill.

[21] Appl. No.: 409,130

[22] Filed: Mar. 23, 1995

[51] Int. Cl.$^6$ ..................................................... H01R 43/00
[52] U.S. Cl. .......................... 29/827; 257/666; 257/672; 438/51
[58] Field of Search ................... 174/52.1–52.4; 361/764, 774, 775; 257/731, 732, 733, 666, 672; 439/68, 70; 437/54, 180, 211, 209; 29/827

[56] References Cited

U.S. PATENT DOCUMENTS

| | | | |
|---|---|---|---|
| 3,908,075 | 9/1975 | Jackson et al. | 428/133 |
| 4,807,087 | 2/1989 | Sawaya | 439/83 X |
| 4,809,135 | 2/1989 | Yerman | 361/772 |
| 5,088,930 | 2/1992 | Murphy | 439/70 |
| 5,118,298 | 6/1992 | Murphy | 439/68 |
| 5,233,131 | 8/1993 | Liang | 174/52.4 |
| 5,263,241 | 11/1993 | Hart et al. | 29/827 |
| 5,299,091 | 3/1994 | Hoshi | 361/723 |
| 5,352,851 | 10/1994 | Wallace et al. | 174/52.4 |
| 5,357,674 | 10/1994 | Lumbard | 29/843 |

FOREIGN PATENT DOCUMENTS 9309918  12/1993  Germany.

OTHER PUBLICATIONS

Binder et al., "Anforderungen an Das Packaging Von KFZ–Sensoren", Technisches Messen TM, vol. 56, No. 11, Nov. 1989, pp. 444–453.

*Primary Examiner*—Hyung S. Sough
*Attorney, Agent, or Firm*—Bruce T. Neel

[57] ABSTRACT

A method of forming a package assembly (10) including a package (12) that encapsulates an electronic die. A leadframe (30) has edge rails (32), and the die is disposed on the leadframe. The package is formed around the die to encapsulate it, and the leadframe is trimmed to provide a plurality of leads (14) protruding from a first side of the package. This trimming also provides a support (16) connected to a second side of the package. The support is bent to be substantially orthogonal to the common plane containing the leads. A mounting tip (26) on the support is thus disposed outside of the common plane. This support improves the rigidity and natural bending frequency of the package assembly.

7 Claims, 3 Drawing Sheets

5,659,950

METHOD OF FORMING A PACKAGE ASSEMBLY

BACKGROUND OF THE INVENTION

The present invention relates, in general, to electronic packages and, more particularly, to a package assembly for more rigidly supporting an electronic die on a mounting board.

Electronic packages are used to house a wide variety of electronic devices. Typically, these packages are mounted to a printed circuit board. A specific example of such a packaged electronic device is an accelerometer, which may for example be mounted on a circuit board used in an automobile to activate an air-bag. In an accelerometer application, it is important that the package holding the accelerometer device be mounted rigidly so that, for example, erroneous vibrations from an automobile do not interfere with the proper sensing of vehicle acceleration or deceleration.

In a prior package, a separate support bracket is attached to the accelerometer package with an adhesive, and the support itself is mounted to extra holes in the circuit board to provide additional rigidity for the package. Although this prior approach provides sufficient rigidity for proper functioning of the accelerometer, it has the disadvantages of the need for additional assembly components and steps, and also the need for a larger foot-print on the circuit board due to the extra surface area required for mounting the bracket.

Accordingly, there is a need for an electronic package assembly that provides a rigid mount to a circuit board, but is less expensive and occupies less board area than prior package assemblies.

DETAILED DESCRIPTION OF THE DRAWINGS

Briefly stated, the present invention provides a package assembly including a package for enclosing a die. A plurality of leads protrude from the package and have a plurality of mounting tips in a substantially common plane. The package assembly has a support for increasing the first resonant bending frequency of the package assembly, and the support and the plurality of leads are formed from a common sheet of conductive material. The support has a mounting tip that is offset from the common plane of the plurality of leads by a fixed distance, and the support is electrically isolated from the die. The die is, for example, an accelerometer, and an advantage of the package assembly is that the support increases the rigidity of the assembly sufficiently so that the accelerometer does not falsely sense accelerations due to package resonance.

The present invention is more fully described below with reference to FIGS. 1–4. This description occasionally refers to the specific case of a package assembly used for an accelerometer, but one of skill in the art will appreciate that the package assembly of the present invention may be used with a wide variety of other electronic die. The references to the accelerometer application below are for the purpose of illustration only.

Figure 1:
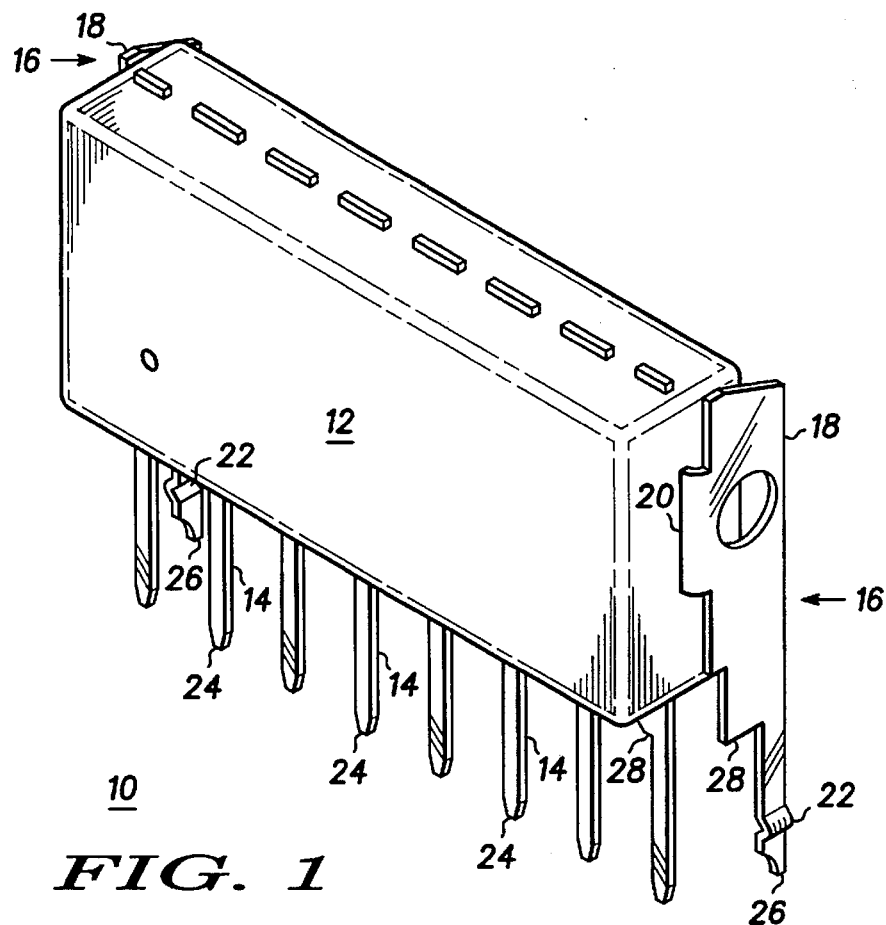
FIG. 1 is a perspective view of a package assembly according to the present invention.

FIG. 1 is a perspective view of a package assembly 10 according to a first embodiment of the present invention. A package 12 has a plurality of leads 14 protruding from a bottom side of package 12, and two supports 16 protrude from vertical sides of package 12. Support 16 comprises flaps 18 and tabs 20, which connect flaps 18 to package 12. Leads 14 have a plurality of mounting tips 24, which mount and electrically connect package 12 to a printed circuit board (not shown) as is known. Also, flaps 18 have mounting tips 26 for further mounting package 12 in additional holes in the printed circuit board. To assist in the mounting of package 12, flaps 18 have detents 22 for temporarily holding package 12 in place during, for example, wave soldering. Leads 14 may also have detents (not shown) to assist in this mounting. After package 12 is mounted, resting edges 28 of both flaps 18 and leads 14 will substantially rest on the surface of the printed circuit board.

Mounting tips 24 of leads 14 are disposed substantially in a common plane because leads 14 are formed from a common conductive sheet of material such as, for example, a leadframe, as is known. According to the present invention, support 16 is also formed from this common conductive sheet, and thus tab 20 is also substantially in the same common plane as mounting tips 24. As will be discussed in more detail below, flaps 18 have been bent to be orthogonal to tabs 20 so that mounting tips 26 of flaps 18 are offset a fixed distance from the common plane of mounting tips 24.

By offsetting the mounting position of tip 26 relative to the common plane of mounting tips 24, the rigidity of package assembly 10 is significantly increased after it has been mounted to the printed circuit board. By way of example, a typical accelerometer for an automobile air-bag application requires an operating vibration frequency range of 0–2,000 Hz. Package 12 is a single in-line package (SIP), and is typically used to mount an accelerometer to a circuit board in an automobile so that the line of action of the accelerometer is parallel to the longitudinal access of the automobile. For example, some prior eight-leaded SIP packages exhibit a first natural resonant bending frequency of about 750 Hz which is below the operating requirement of 2,000 Hz. Thus, this package may cause a false acceleration measurement. However, according to the present invention, the additional rigidity provided by support 16 increases the rigidity of package assembly 10 sufficiently so that the first resonant frequency of package assembly 10 in a mounted position is about 3,000 Hz, which is above the operating requirement of 2,000 Hz.

Generally, as the fixed offset distance of mounting tips 26 from mounting tips 24 increases, the first natural bending frequency of package assembly 10 increases. As a specific example, the offset fixed distance may be about 2 millimeters, but this may vary greatly for other applications. As one of skill in the art will recognize, typically the requirements for package 12 are determined by the particular application, the operating frequency range, and the dies to be encapsulated. The offset fixed distance is selected to provide a first resonant frequency for package assembly 10 that is greater than the required operating range. As one of skill in the art will recognize, as the thickness of leads 14 and/or flaps 18 is increased, a correspondingly smaller offset distance is necessary to achieve a given resonant frequency.

In operation, leads 14 are used for electrical signal inputs/output to a die (see FIG. 2) enclosed within package 12. In contrast, flaps 18 are electrically isolated from the die within package 12. In other words, supports 16 essentially provide only a mechanical mount for package 12.

Also, flaps 18 are preferably bent in the same direction away from the common plane of mounting tips 24, but in other embodiments these bending directions may provide mounting tips 26 on opposite sides of the common plane. Further, the offset fixed distance may be different for each of flaps 18. Generally, the common plane of leads 14 will be substantially perpendicular to the printed circuit board. When used for an accelerometer application, package assembly 10 preferably has a first resonant bending frequency greater than 2,000 Hz.

Figure 3:
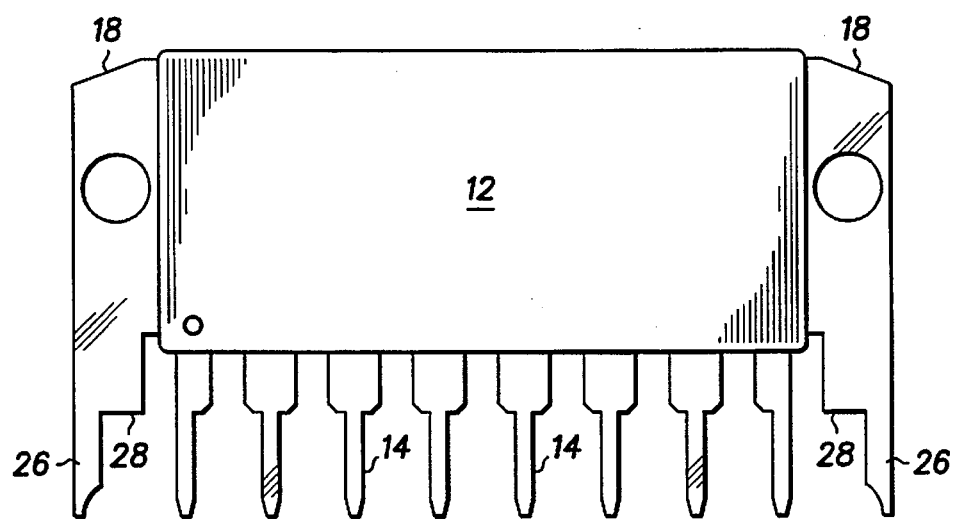
FIG. 3 is a side view of a package prior to bending flaps according to the present invention.
Figure 2:
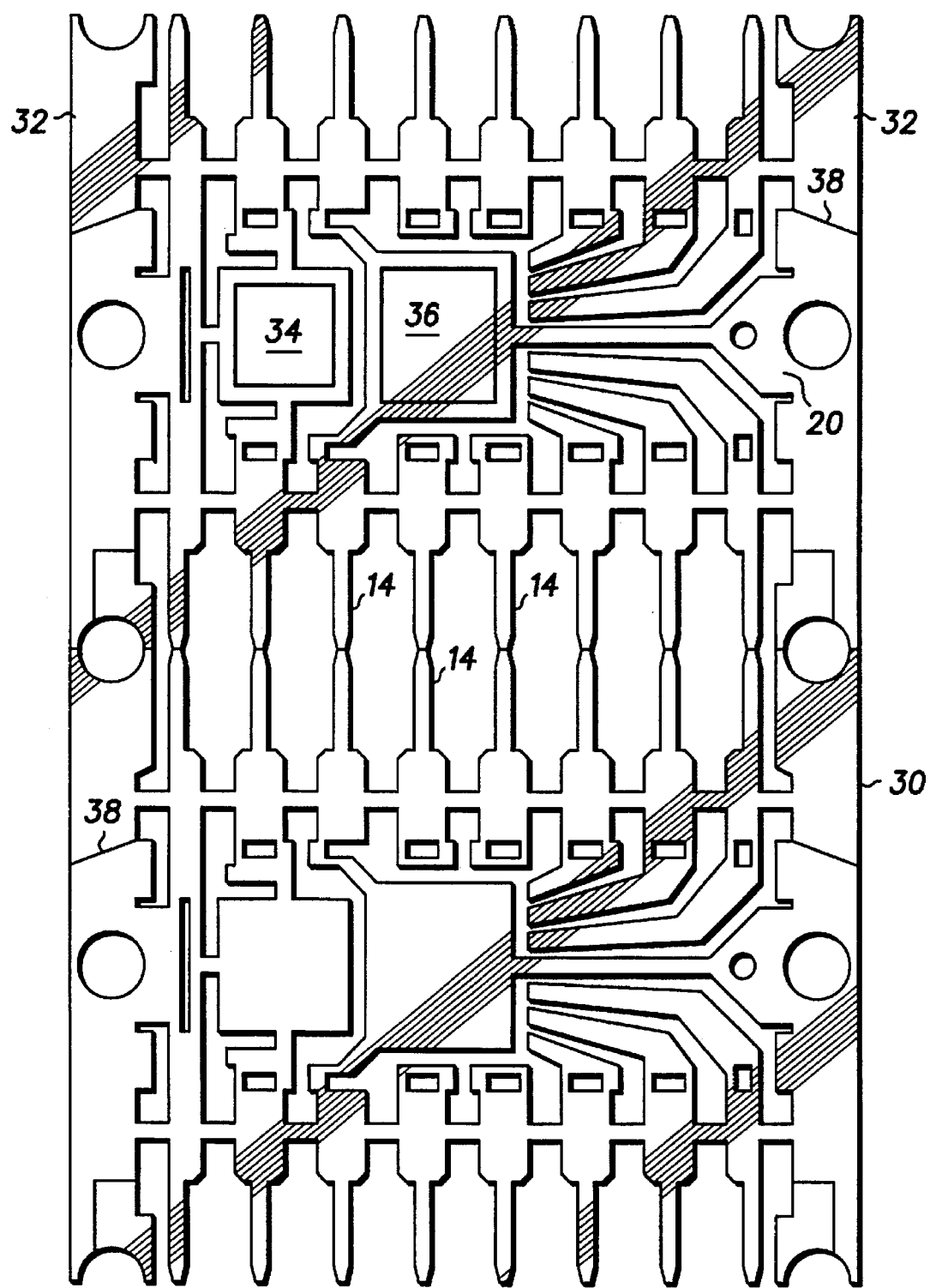
FIG. 2 is a top view of a leadframe for holding sensing and control dies according to the present invention.

FIGS. 2 and 3 illustrate a method, according to the present invention, of forming package assembly 10. Specifically, FIG. 2 is a top view of a leadframe 30 having edge rails 32. A sensing die 34 and a control die 36 are mounted on leadframe 30 as is known. For example, sensing die 34 is a dual-capacitor accelerometer transducer that is electrically coupled to control die 36, and sensing die 34 and control die 36 are attached to leadframe 30 using an adhesive that electrically isolates dies 34 and 36 from leadframe 30, as is known. It should be noted that in this stage of manufacture, leadframe 30 has previously been patterned to provide leads 14, but edge rails 32 have not yet been patterned, as will be discussed below.

After dies 34 and 36 have been mounted, electrical connections are made between dies 34 and 36 and leads 14 using known techniques such as, for example, wire bonding. Then dies 34 and 36 and a portion of leadframe 30 are encapsulated to form package 12. Next, leadframe 30 is trimmed to separate leads 14 and to form flaps 18 using a trim pattern 38. Tab 20 adjoins trim pattern 38 so that flaps 18 will be connected to package 12.

FIG. 3 is a side view of package assembly 10 prior to bending flaps 18 into their final position. Flaps 18 may be trimmed using standard techniques, and flaps 18 are in the same common plane as leads 14 prior to the bending of flaps 18 discussed presently.

The final stage of manufacture involves the bending of flaps 18 into a position orthogonal to the common plane of lead 14. This bending is done using techniques known to those of skill in the art. Optionally, detents 22 (see FIG. 1) are formed in flaps 18 and/or leads 14 at this stage.

One of skill in the art will recognize that numerous materials may be used for leadframe 30 and package 12. For example, leadframe 30 may be a metal formed of aluminum, and package 12 may be formed from a thermo-set plastic.

As a specific, non-limiting example of the present invention, a package assembly substantially similar to that shown in FIG. 1 was assembled and mounted on a printed circuit board. The package assembly was tested using holographic modal testing to determine its resonant frequencies, and this testing determined that the resonant frequency was 3,675 Hz. Another package assembly without supports 16 was mounted on a printed circuit board and similar testing established the resonant frequency to be 810 Hz.

Figure 4:
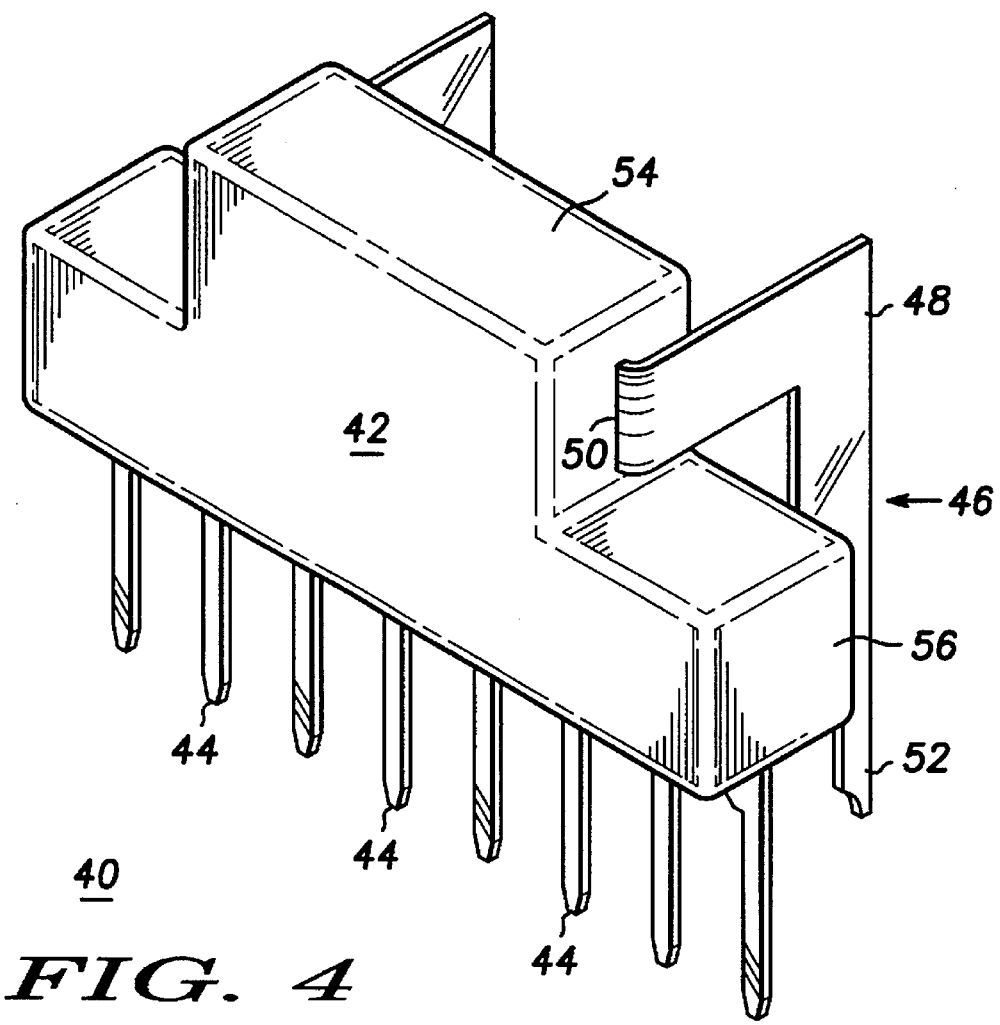
FIG. 4 is a perspective view of a package assembly according to an alternative embodiment of the present invention.

FIG. 4 is a perspective view of a package assembly 40 according to an alternative embodiment of the present invention. A package 42 has a plurality of leads 44 protruding therefrom, and a support 46 includes a flap 48 connected to package 42 by a tab 50. Flap 48 has a mounting tip 52 disposed outside of the common plane of leads 44 by an offset distance. Also, flap 48 is substantially orthogonal to this common plane. An advantage of package assembly 40 is that supports 46 may act as a heat conduction path from a device (not shown) enclosed in a top portion 54 of package 42. Such a heat conduction path is shorter than if supports 46 were disposed on a side 56 of package 42.

By now, it should be appreciated that there has been provided a novel package assembly having supports that improve the rigidity and vertical support of electronic packages mounted to printed circuit boards. This improved rigidity leads to increased natural resonant frequencies greater than 2,000 Hz. Another advantage is that the package assembly requires a smaller foot-print than prior packages. This is so because a separate mounting bracket is not required as supports 16 are formed from a common sheet of material with leads 14. Further, the elimination of such a separate mounting bracket reduces the cost of the package assembly.

Although the present invention has been described above with reference to specific package types and accelerometer application, one of skill in the art will understand that the present invention may also be used to advantage with other electronic devices that are sensitive to vibration and shock impulse or that require precise alignment. One such example is an opto-electronic component.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method of forming a package assembly, comprising the steps of:

provinding a leadframe having an edge rail;

disposing an accelerometer on said leadframe;

encapsulating said accelerometer within a package formed around both said accelerometer and a portion of said leadframe proximate to said accelerometer;

trimming said leadframe to provide a plurality of leads protruding from a first side of said package and a support connected to a second side of said package, wherein said plurality of leads is electrically coupled to said accelerometer and has a plurality of mounting tips disposed in a substantially common plane and said support is electrically isolated from said accelerometer; and bending said support so that a mounting tip of said support is disposed substantially outside of said substantially common plane to increase a resonance frequency for said accelerometer to greater than about 2,000 Hz.

2. The method of claim 1 wherein:

said support comprises a flap and a tab, said tab connects said flap to said package, and said tab is substantially in said substantially common plane; and said flap is disposed substantially orthogonal to said tab after said step of bending.

3. The method of claim 2 wherein said plurality of leads protrudes from only a first side of said package and said tab protrudes from a second side of said package.

4. The method of claim 3 further comprising the step of forming a detent in said mounting tip of said support.

5. The method of claim 3 wherein said step of disposing an accelerometer further comprises disposing a control die on said leadframe proximate to said accelerometer, wherein said control die is electrically coupled to said accelerometer.

6. The method of claim 1 wherein said step of bending said support provides a resonant frequency of said package assembly of about 3,000 Hz.

7. The method of claim 1 wherein said mounting tip is disposed outside of said substantially common plane by a distance of about 2 millimeters.

* * * * *